United States Patent
Tsai et al.

[11] Patent Number: 5,911,839
[45] Date of Patent: Jun. 15, 1999

[54] HIGH EFFICIENCY GAINP NIP SOLAR CELLS

[75] Inventors: Chin Yao Tsai; Yan-Kuin Su; Shoou Jinn Chang, all of Tainan, Taiwan

[73] Assignee: National Science Council of Republic of China, Taipei, Taiwan

[21] Appl. No.: 08/766,047

[22] Filed: Dec. 16, 1996

[51] Int. Cl.⁶ .................................................. H01L 31/00
[52] U.S. Cl. .................................................. 136/262
[58] Field of Search ........................................ 136/262

[56] References Cited

U.S. PATENT DOCUMENTS 5,217,539  6/1993  Fraas et al. .............................. 136/262
5,316,593  5/1994  Olson et al. ............................. 136/262
5,342,453  8/1994  Olson ...................................... 136/262

*Primary Examiner*—Mark Chapman
*Attorney, Agent, or Firm*—Bacon & Thomas, PLLC

[57] ABSTRACT

The present invention is related to a high efficiency indium gallium phosphide NIP solar cell, wherein an intrinsic layer between a emitter layer and base layer can suppress the Zn memory effect and interdiffusion and also a higher doping concentration in n-type AlInP window layer can be attained and the lifetime of minority carriers also increase for improving the conversion efficiency, thus the present invention may be used in the superhigh efficiency tandom cell so as to be used in the space or in earth as an regenerated energy.

11 Claims, 7 Drawing Sheets

| | | |
|---|---|---|
| AuGe | | |
| GaAs:Se | $1*10^{19} cm^{-3}$ | 500nm |
| AlInP:Se | $3*10^{18} cm^{-3}$ | 20nm |
| GaInP:Se | $3*10^{18} cm^{-3}$ | 50nm |
| GaInP | | 300nm |
| GaInP:Zn | $2*17^{17} cm^{-3}$ | 1.2μm |
| GaInP:Zn | $1.5*10^{18} cm$ | 300nm |
| GaAs:Zn | $3*10^{18} cm$ | 500nm |
| GaAs:Zn | | |
| AuZn | | |

| | | |
|---|---|---|
| GaAs:Zn | $4*10^{18}cm^{-3}$ | 500nm |
| AlInP:Zn | $4*10^{17}cm^{-3}$ | 20nm |
| GaInP:Zn | $1*10^{18}cm^{-3}$ | 300nm |
| GaInP:Se | $1*10^{17}cm^{-3}$ | 700nm |
| AlGaInP:Se | $4*10^{17}cm^{-3}$ | 300nm |
| GaAs:Se | $5*10^{17}cm^{-3}$ | 100nm |
| GaAs:Si | | |

*FIG. 1A*

| | | |
|---|---|---|
| GaAs:Se | $1*10^{19}cm^{-3}$ | 500nm |
| AlInP:Se | $1*10^{18}cm^{-3}$ | 20nm |
| GaInP:Se | $3*10^{18}cm^{-3}$ | 50nm |
| GaInP:Zn | $1*10^{17}cm^{-3}$ | 1.5μm |
| GaInP:Zn | $1.5*10^{18}cm^{-3}$ | 300nm |
| GaAs:Zn | $3*10^{18}cm^{-3}$ | 500nm |
| GaAs:Zn | | |

*FIG. 1B*

| | | |
|---|---|---|
| GaAs:Se | $1*10^{19} cm^{-3}$ | 500nm |
| AlInP:Se | $1*10^{18} cm^{-3}$ | 20nm |
| GaInP:Se | $3*10^{18} cm^{-3}$ | 50nm |
| GaInP | | 500nm |
| GaInP:Zn | $3*10^{17} cm^{-3}$ | 1μm |
| GaInP:Zn | $1.5*10^{18} cm^{-3}$ | 300nm |
| GaAs:Zn | $3*10^{18} cm^{-3}$ | 500nm |
| GaAs:Zn | | |

FIG. 1C

| AuGe | | |
|---|---|---|
| GaAs:Se | $1*10^{19}cm^{-3}$ | 500nm |
| AlInP:Se | $3*10^{18}cm^{-3}$ | 20nm |
| GaInP:Se | $3*10^{18}cm^{-3}$ | 50nm |
| GaInP | | 300nm |
| GaInP:Zn | $2*17^{17}cm^{-3}$ | 1.2μm |
| GaInP:Zn | $1.5*10^{18}cm$ | 300nm |
| GaAs:Zn | $3*10^{18}cm$ | 500nm |
| GaAs:Zn | | |
| AuZn | | |

*FIG. 4*

HIGH EFFICIENCY GAINP NIP SOLAR CELLS

BACKGROUND OF THE INVENTION

1. Field of the Invention

The present invention is related to a structure of high efficiency solar cell, especially, to a high efficiency indium gallium phosphide NIP solar cell wherein an intrinsic layer between an emitter layer and base layer can suppress the Zu memory effect and interdiffusion and also a higher doping concentration in the n-type AlInP window layer can be attained and the lifetime of minority carriers also increase which improve the conversion efficiency.

2. Description of the Prior Art

The present invention is related to a high efficiency solar cell structure, especially, to a high efficiency indium gallium phosphide NIP solar cell wherein an intrinsic layer between a emitter layer and base layer can suppress the Zn memory effect and interdiffusion and also a higher doping concentration in the n-type AlInP window layer can be attained and the lifetime of minority carriers also increase which improve the conversion efficiency.

Nowadays, electric power may be generated from hydroelectricity, heat, fuel, nuclear and solar power, wherein the most important power generation method is solar power, because the equipment of solar power generation is the most compact and economic one, and since no fuel is needed so the environment will not be polluted.

In order to produce the energy supply in the 21st century and also considering the problem of environment protection, solar power is the most important and nowadays the key point about research of solar power is how to improve the conversion efficiency thereof. Now the highest efficiency of the solar cell is the tandem cell which is combined from GaInP/GaAs under the condition of AMO the efficiency of the tandem cell is about 30%. The principle thereof is to use two solar cells with two different absorption bands which are connected by a tunnel diode. The focus about the tandem cell is a GaInP solar cell in the upper layer thereof since the GaAs solar cell is a mature product either in experimental environment or in the commercial usage. In the prior art there are two structures about the GaInP:

(1) P/N type, that is, the P type is positioned atop the N type, the defect of which is that generally the window is made of indium gallium aluminum phosphide, but the highest concentration of P type dopant in this material is $5 \times 10^{17}$ cm$^{-3}$, thus it will increase the serial resistance and the light with short wavelength will be absorbed too much, therefore, the conversion efficiency of the solar cell may be reduced.

(2) N/P type, that is, the N type is positioned atop the P type, the trouble induced from this N/P type structure is that generally the P type dopant, zinc, has special memory effect, and could be decomposed through diffusion or by other growth material containing zinc to dope into the N type layer continuously so that the whole conversion efficiency is reduced.

SUMMARY OF THE INVENTION

From the aforementioned description, there are objects to be overcome for improving solar cell structure. Therefore, the inventor of the present invention designed an intrinsic layer for preventing zinc diffusion into said emitter layer so that the lifetime of the majority of carriers is prolonged, thus the object of improving the conversion effect of high efficiency indium gallium phosphide NIP solar cell is attained.

The NIP solar cell structure of the present invention is designed for overcoming defects of said conventional solar cell. That is, an intrinsic layer is added to a high efficiency NP structure for suppressing the memory effect of zinc, which is similar to an amorphous silicon solar cell in which a structure similar to PIN structure is used to prolong the lifetime of minority carriers, and from the simulations and experiments result, it is asserted that the NIP structure is the best structure for use in the solar cell.

The area of the NIP solar cell of the present invention is $2 \times 2$ cm$^2$, and the conversion efficiency thereof is 15.7% under AMO condition. This is the highest efficiency in the world under such large area. There are three advantages in the NIP solar cell structure:

(1) The defects of the conventional p type-n type (P/N) structure are reduced, since the p type dopant in the indium gallium aluminum phospide of the window layer in the P/N type solar cell is difficult to reach the value of $1 \times 10^{18}$ cm$^{-3}$ so that the serial resistance is increased, accordingly, the efficiency is reduced; but generally the n type dopant of the NIP structure in the present invention may be higher than the value of $1 \times 10^{18}$ cm$^{-3}$, thus the efficiency is improved.

(2) The trouble during the growth of the n type-p type is solved. In general the p type dopant is zinc (Zn), but zinc has memory effect, thus it may diffuse into the n type layer, therefore, a trap is generated in the interface so to reduce the working efficiency. Accordingly, in the present invention an intrinsic layer is added to the NIP structure so that the zinc may diffuse in the i type structure, but which will not diffuse into the n type layer so to reduce the difficulty occurring in growth.

(3) By using computer simulation, even if the N/P dopant has no so called memory effect, the NIP structure still has higher efficiency than the NP structure as a PIN structure is adapted in the amorphous silicon solar cell for prolonging the lifetime of minority carriers.

BRIEF DESCRIPTION OF THE DRAWINGS

The invention, as well as its many advantages, may be liner understood by the following description and drawings in which:

FIG. 1(A) shows the structure of P/N type indium gallium phosphide solar cell; (B) shows the structure of N/P type indium gallium phosphide solar cell; (C) shows the structure of NIP type indium gallium phosphide solar cell;

FIG. 4 shows the detailed structure of the highest efficiency of NIP indium gallium phosphide solar cell structure in the present invention;

DETAILED DESCRIPTION OF TIE PREFERRED EMBODIMENT

In order to develop a preferred structure of indium gallium phosphide solar cell, three different kinds of solar cell structure had been developed, they are P/N type, N/P type and NIP type, wherein the structures of P/N and N/P types contains a substrate, a buffer layer, a back surface field layer (BSF), a base layer, an intrinsic layer, an emitter layer, a window layer and a cap layer. The intrinsic materials, dopant impurities, and dopant concentrations of all layers are shown in the FIGS. 1(A) and (B), and the metal contacts are positioned on the cap layer of gallium arsenide, and the lattices between the metals is removed by wet etching, furthermore an $Si_3N_4$ is used as an anti-reflection layer.

Since in our system the dopant concentration of AlInP is attained at most only $4 \times 10^{17}$ cm$^{-3}$, we had tried to change the width of the AlInP and had derived a preferred width of 20 nm as the width of the window layer.

Figure 2:
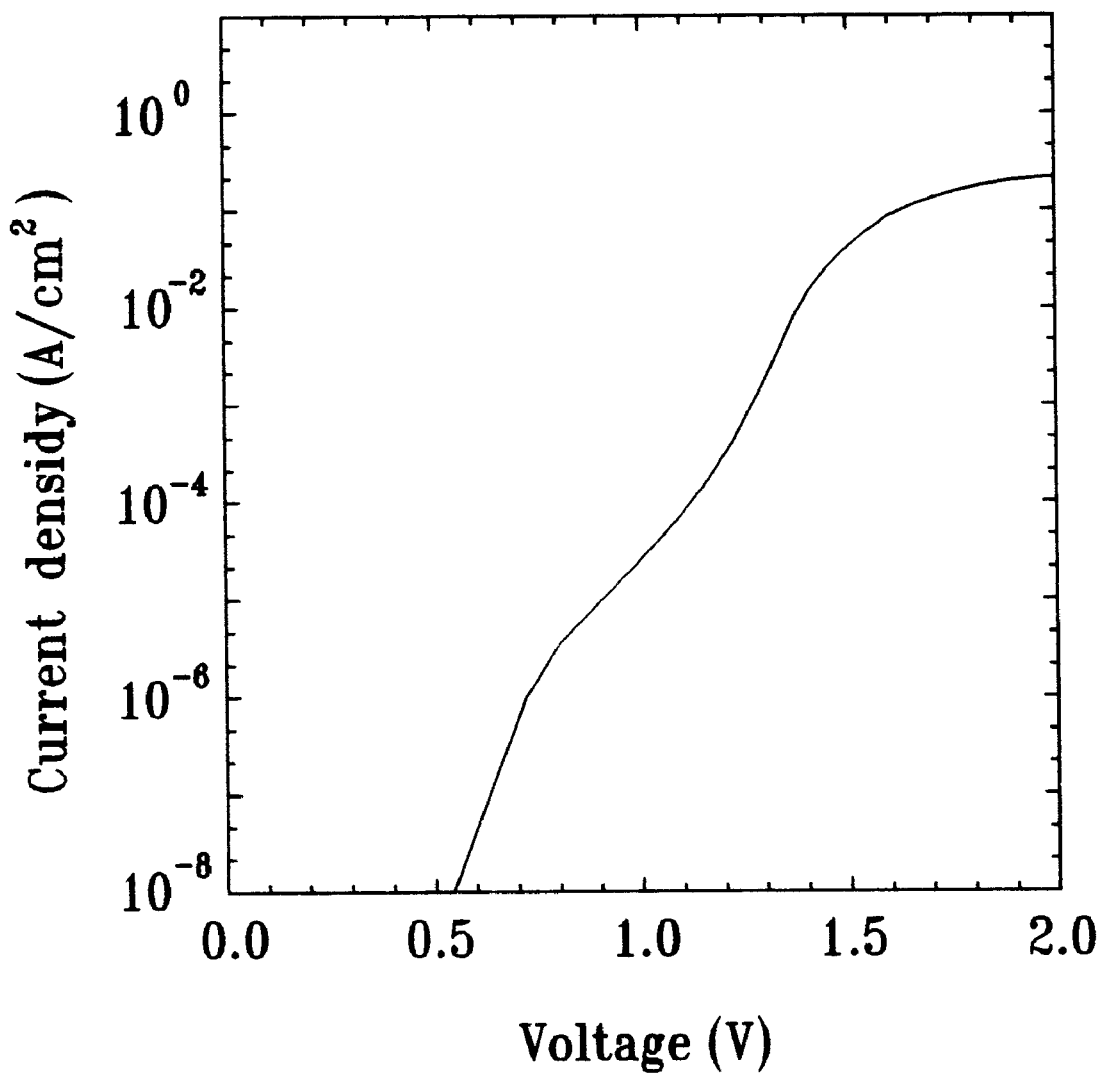
FIG. 2 shows the characteristic of dark current and voltage in the indium aluminum phosphide window layer of P/N type indium gallium phosphide solar cell with a width of 20 nm.
Figure 3:
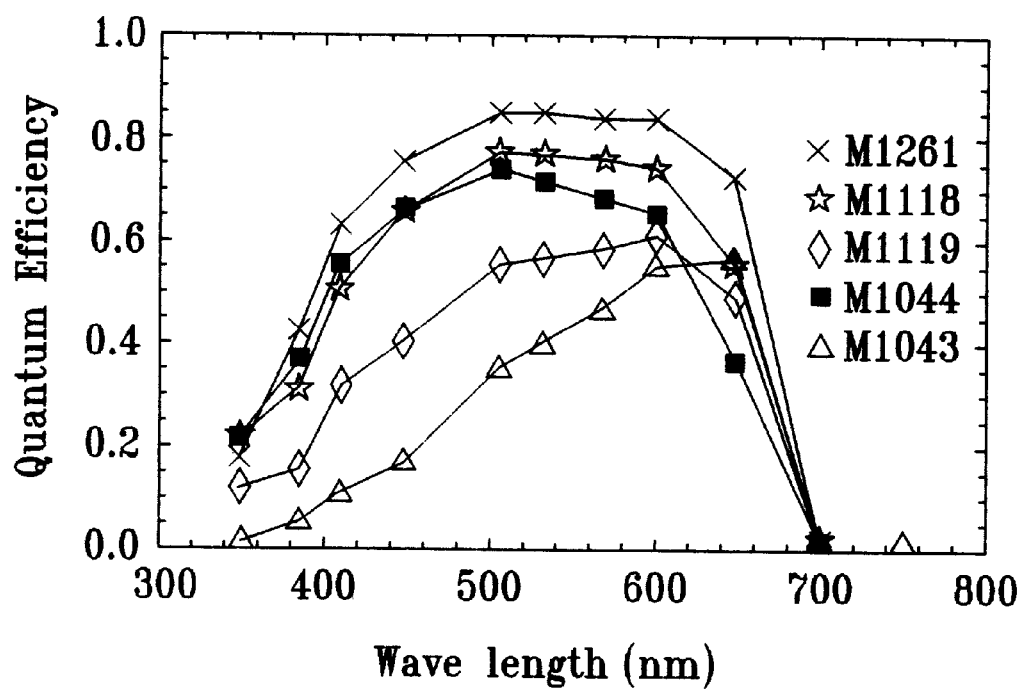
FIG. 3 shows the characteristic of quantum conversion efficiency in the NIP type (M1261, M1118, M1119), N/P type (M1044), and P/N type (M1043) type indium gallium phosphide solar cell.

The appended Table shows the measured results for three different kinds of GaInP solar cell structure, in which the "cell No." means the reference number of the samples, "structure" means the structure of the solar cell, "P" is the dopant concentration of p type dopant, I represents the width of intrinsic layer, Vcc represents the voltage of the open circuit, Jsc is the circuit density of short circuit, FF is the fill factor and η is efficiency. It is appreciated from Table 1 that the conversion efficiency of the P/N structure solar cell as shown in FIG. 1(A) is only 6%, and the contact resistance thereof is 2Ω-cm$^2$, this is because of the dopant concentration of window layer AlInP:Zn is too low. From measurement results of the dark I–V characteristics from FIG. 2, it is obvious that there is a high serial resistance of 1Ω-cm$^2$, moreover, it is illustrated in FIG. 3 that the short wavelength quantum conversion efficiency is reduced due to such a high serial resistance. In order to overcome the impossibility for improving the concentration of AlInP with Zn dopant, the original P/N structure is changed to a N/P structure, since the dopant concentration of n type dopant, $SeH_2$, would be attained to $1 \times 10^{18}$ cm$^{-3}$. It is appreciated from Table 1 that the conversion efficiency of N/P type indium gallium phosphide solar cell structure could be improved to 9.5%, and the current concentration is improved from 7.78 mA/cm$^2$ to 12.64 mA/cm$^2$, and shown in FIG. 3, within the range of wavelength, the quantum conversion efficiency is improved obviously. Besides, in general the serial resistance is less than the value of $10^{-3}$Ω/cm$^2$.

Since Zn is easy to volatilize, it is easy to be doped by the background impurity during the growth of expitaxy and is easy to diffuse into the lower layer, such as the n type emitter of N/P structure, thus some trap centers are generated and some carriers are captured, therefore the lifetime of minority carriers are reduced. In order to reduce the aforementioned problem, an intrinsic layer is inserted between the emitter layer and base layer (that is a NIP structure) for preventing Zn interdiffusing into the emitter, thus the lifetime of minority carriers is prolonged as those in the amorphous silicon solar cell so as to improved the conversion efficiency. Said NIP structure is shown in FIG. 1(C), the difference between said structure and the prior P/N and N/P structures is that an additional intrinsic layer is added. In order to perform comparison more easily, the sum of the width of intrinsic layer and the width of p type layer is fixed to 1.5 μm, then we try to search for a preferred width for the intrinsic layer.

Figure 5:
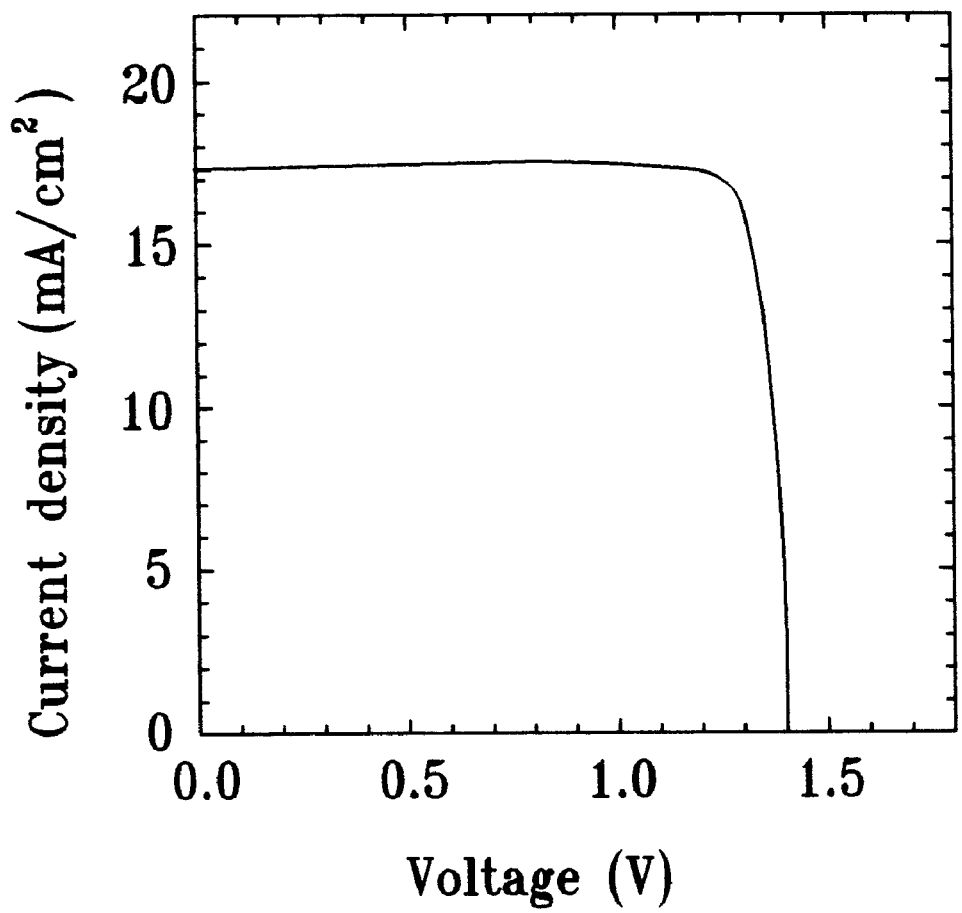
FIG. 5 the characteristic of the current and voltage of the highest efficiency of NIP indium gallium phosphide solar cell structure in the present invention.
Figure 6:
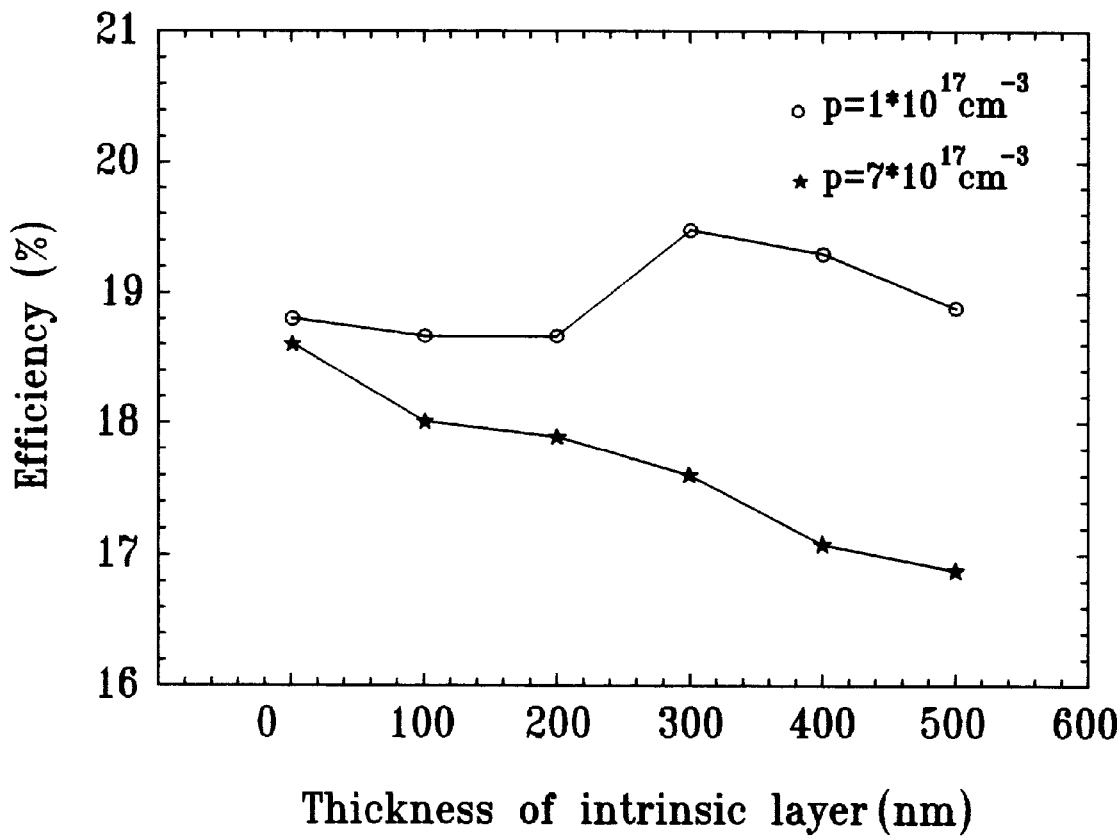
FIG. 6 is the comparing results of the efficiency of the N/P type and P/N type indium gallium phosphide solar cell structure by simulation; and Table 1 lists the measured results of three different GaInP solar cell structure under AMO condition (25° C.).

Shown in FIG. 4 is the NIP solar cell structure with better conversion efficiency, wherein the gallium arsenide substrate doped with zinc is contained in said structure, a buffer layer of gallium arsenide with a width of 500 nm and the zinc concentration of which is $3 \times 10^{18}$ cm$^{-3}$, a back surface field layer of indium gallium phosphide with a width of 300 nm and the zinc concentration of which is $15 \times 10^{18}$ cm$^{-3}$, a base layer of indium gallium phosphide with a width of 1.2 μm and the zinc concentration of which is $2 \times 10^{17}$ cm$^{-3}$, an intrinsic layer of indium gallium phosphide with a width of 300 mn, a emitter layer of indium potassium phosphide with a width of 50 nm and the selenium concentration of which is $3 \times 10^{18}$ cm$^{-3}$, a window layer of indium aluminum phosphide with a width of 20 nm and the selenium concentration of which is $3 \times 10^{18}$ cm$^{-3}$, and a cap layer of gallium arsenide with a width of 500 nm and the selenium concentration of which is $1 \times 10^{19}$ cm$^{-3}$ are grew thereon, and finally an AuGe is plated in the front thereof and an AuZn is plated in the back thereof then the gallium arsenide is etched by the HCl and $H_2O$ (with the ratio of 1:2), and then 600 nm of $Si_3N_4$ is used as anti-reflection layer, thus the I–V characteristic of the preferred NIP solar cell structure is shown in FIG. 5, and it is know from the figure that the quantum conversion efficiency and all the wave ranges have been improved greatly. The area of the NIP solar cell is $2 \times 2$ cm$^2$, the voltage thereof is 1420 mV, the short circuit current density is 17.22 mA/cm$^2$, and filling factor is 88%. The conversion efficiency of said solar cell structure under the condition of AMO is 15.7%, which is the best conversion efficiency under such large area for such kind of material in the world A computer simulation is used to illustrate whether the NIP construction have better convention efficiency than N/P structure substantially. Now referring to FIG. 6, as the dopant concentration of p type dopant is $1 \times 10^{17}$ cm$^{-3}$ and the width of intrinsic layer is larger than 300 nm, even if N/P have very actuate dopant concentration (without the so called "memory effect" and "diffusion function", the NIP still has better conversion efficiency.

From the aforementioned description, it is appreciated that in the present invention the solar cell structure is delicately designed to effectively enhance the conversion efficiency of the conventional solar cell so that the present invention may be used in the superhigh efficiency tandom cell, such as GaInP/GaAs, so as to be used in the space or in Earth as a regenerated energy.

INDEX
(1) K. A. Bertness, S. R. Kurtz, D. J. Friedman, A. E. Kramer, J. M. Olson, Appl, Phys. Lett. 65,989 (1994).
(2) S. J. Wojtczuk, S. M. Vernon, M. M. Sanficon, Proc. 23rd IEEE Photovoltaic Spec. Conf., 655(1993).
(3) A. van Geelen, R. A. J. Thomeer, P. R. Hageman, G. J. Bauhu, P. C. van Rijsingen, L. J. Gilling, Proc. 12th EC PVSEC., 859(1994).
(4) P. K. Chiang, P. S. Vijayakumar, B. T. Cavicchi, Proc. 23rd IEEE Photovoltaic Spec. Conf., 659(1993).

Many changes and modifications in the above described embodiment of the invention can, of course, be carried out without departing from the scope thereof. Accordingly, to promote the progress in science and the usefull arts, the invention is disclosed and is intended to be limited only by the scope of the appended claims.

TABLE 1

| Cell No. | Structure | P (cm$^{-3}$) | I (nm) | $V_{oc}$ (mV) | $J_{sc}$ (mA/cm$^2$) | FF (%) | η (%) |
|---|---|---|---|---|---|---|---|
| M1043 | P/N (BSF) | | | 1345 | 7.78 | 77.2 | 6 |
| M1044 | N/P | 1 * 10$^{17}$ | 0 | 1267 | 12.64 | 80 | 9.5 |
| M1119 | NIP | 7 * 10$^{17}$ | 200 | 1372 | 13.03 | 88 | 11.9 |
| M1118 | NIP | 7 * 10$^{17}$ | 500 | 1362 | 14.41 | 87.7 | 12.7 |
| M1260 | NIP | 3 * 10$^{17}$ | 500 | 1401 | 16.44 | 87.9 | 15 |
| M1261 | NIP | 1 * 10$^{17}$ | 500 | 1409 | 16.21 | 87.3 | 14.8 |

What is claimed is:

1. A high efficiency indium gallium phosphide NIP solar cell having a structure which comprises a dopant gallium arsenide substrate on which a buffer layer, a back surface field layer (BSF), a base layer, an intrinsic layer, an emitter layer, a window layer, and a cap layer have been grown, an AuGe layer is plated on the cap and an AuZn is plated in the back of the substrate, and the cap layer etched by the HCl and H$_2$O, finally an anti-reflection layer being plated, and the intrinsic layer between the emitter layer and the base layer prevents Zn being defused into the emitter, thus the lifetime of minority carriers being prolonged so as to improve the conversion efficiency.

2. The high efficiency indium gallium phosphide NIP solar cell as claimed in claim 1, wherein the buffer layer is a gallium arsenate layer with a width of 500 nm and the zinc concentration of which is $3 \times 10^{18}$ cm$^{-3}$.

3. The high efficiency indium gallium phosphide NIP solar cell as claimed in claim 1, wherein the back surface field layer is an indium gallium phosphide layer with a width of 300 nm and the zinc concentration of which is $1.5 \times 10^{18}$ cm$^{-3}$.

4. The high efficiency indium gallium phosphide NIP solar cell as claimed in claim 1, wherein the base layer is an indium gallium phosphide layer with a width of 1.2 $\mu$m and the zinc concentration of which is $2 \times 10^{17}$ cm$^{-3}$.

5. The high efficiency indium gallium phosphide NIP solar cell as claimed in claim 1, wherein the intrinsic layer is an intrinsic indium gallium phosphide layer with a width of 300 nm.

6. The high efficiency indium gallium phosphide NIP solar cell as claimed in claim 1, wherein the emitter layer is an indium gallium phosphide layer with a width of 50 nm and the selenium concentration of which is $3 \times 10^{18}$ cm$^{-3}$.

7. The high efficiency indium gallium phosphide NIP solar cell as claimed in claim 1, wherein the window layer is an indium aluminium phosphide layer with a width of 20 nm and the selenium concentration of which is $3 \times 10^{18}$ cm$^{-3}$.

8. The high efficiency indium gallium phosphide NIP solar cell as claimed in claim 1, wherein the cap layer is a gallium arsenide layer with a width of 500 nm and the selenium concentration of which is $1 \times 10^{19}$ cm$^{-3}$.

9. The high efficiency indium gallium phosphide NIP solar cell as claimed in claim 1, wherein the ratio of HCl and H$_2$O is 1:20.

10. The high efficiency indium gallium phosphide NIP solar cell as claimed in claim 1, wherein the anti-reflection layer is a Si$_3$N$_4$ layer with a width of 600 nm.

11. The high efficiency indium gallium phosphide NIP solar cell as claimed in claim 1, wherein the buffer layer is a gallium arsenate layer with a width of 500 nm and the zinc concentration of which is $3 \times 10^{18}$ cm$^{-3}$; the back surface field layer is an indium gallium phosphide layer with a width of 300 nm and the zinc concentration of which is $1.5 \times 10^{18}$ cm$^{-3}$; the base layer is an indium gallium phosphide layer with a width of 1.2 $\mu$m and the zinc concentration of which is $2 \times 10^{17}$ cm$^{-3}$; and the intrinsic layer is an intrinsic indium gallium phosphide layer with a width of 300 nm.

\* \* \* \* \*